(12) United States Patent
Bang et al.

(10) Patent No.: US 11,469,374 B2
(45) Date of Patent: Oct. 11, 2022

(54) ORGANIC LIGHT-EMITTING DISPLAY APPARATUS AND METHOD OF MANUFACTURING THE SAME

(71) Applicant: Samsung Display Co., Ltd., Yongin-si (KR)

(72) Inventors: Hyunsung Bang, Yongin-si (KR); Arong Kim, Yongin-si (KR); Jungsun Park, Yongin-si (KR); Duckjung Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/094,281

(22) Filed: Nov. 10, 2020

(65) Prior Publication Data

US 2021/0057648 A1 Feb. 25, 2021

Related U.S. Application Data

(62) Division of application No. 15/646,908, filed on Jul. 11, 2017, now Pat. No. 10,879,466.

(30) Foreign Application Priority Data

Jul. 29, 2016 (KR) ........................ 10-2016-0097029

(51) Int. Cl.
*H01L 51/00* (2006.01)
*H01L 27/32* (2006.01)
(Continued)

(52) U.S. Cl.
CPC ...... *H01L 51/0016* (2013.01); *H01L 27/3246* (2013.01); *H01L 27/3283* (2013.01);
(Continued)

(58) Field of Classification Search
CPC ............. H01L 51/0016; H01L 27/3246; H01L 27/3283; H01L 51/5012; H01L 51/5056;
(Continued)

(56) References Cited

U.S. PATENT DOCUMENTS

| 7,781,963 B2 | 8/2010 | Yoshida et al. |
| 2001/0024083 A1 | 9/2001 | Yamazaki et al. |

(Continued)

FOREIGN PATENT DOCUMENTS

| CN | 1477911 | 2/2004 |
| CN | 101543135 | 9/2009 |

(Continued)

OTHER PUBLICATIONS

Non-Final Office Action issued in U.S. Appl. No. 15/646,908 dated Mar. 19, 2019.

(Continued)

*Primary Examiner* — Shahed Ahmed
*Assistant Examiner* — Vicki B. Booker
(74) *Attorney, Agent, or Firm* — H.C. Park & Associates, PLC

(57) ABSTRACT

An organic light-emitting display apparatus including: a substrate; a plurality of first electrodes spaced apart from each other on the substrate; a plurality of organic functional layers respectively covering an upper surface and side surfaces of the plurality of first electrodes, each of the plurality of organic functional layers including an emission layer; a first bank disposed between the plurality of organic functional layers and not directly contacting the plurality of first electrodes; and a second electrode disposed on the plurality of organic functional layers.

9 Claims, 17 Drawing Sheets

(51) Int. Cl.
*H01L 51/50* (2006.01)
*H01L 51/52* (2006.01)
*H01L 51/56* (2006.01)

(52) U.S. Cl.
CPC ...... *H01L 51/5012* (2013.01); *H01L 51/5056* (2013.01); *H01L 51/5072* (2013.01); *H01L 51/5088* (2013.01); *H01L 51/5092* (2013.01); *H01L 51/5206* (2013.01); *H01L 51/5228* (2013.01); *H01L 51/56* (2013.01)

(58) Field of Classification Search
CPC ............ H01L 51/5072; H01L 51/5088; H01L 51/5092; H01L 51/5206; H01L 51/5228; H01L 51/56
See application file for complete search history.

(56) References Cited

U.S. PATENT DOCUMENTS

| | | |
|---|---|---|
| 2004/0061121 A1 | 4/2004 | Uchida |
| 2007/0159086 A1 | 7/2007 | Yu et al. |
| 2009/0068574 A1 | 3/2009 | Kitazawa et al. |
| 2010/0327297 A1 | 12/2010 | Yoshida et al. |
| 2011/0024083 A1 | 2/2011 | Steimel |
| 2015/0014661 A1 | 1/2015 | Joo et al. |
| 2015/0200236 A1 | 7/2015 | Kim et al. |
| 2016/0043161 A1 | 2/2016 | Miyazawa |
| 2016/0133677 A1 | 5/2016 | Yamamoto et al. |
| 2016/0172424 A1 | 6/2016 | Hosono et al. |
| 2018/0358573 A1 | 12/2018 | Maeda et al. |

FOREIGN PATENT DOCUMENTS

| | | |
|---|---|---|
| JP | 2002-170669 | 6/2002 |
| JP | 2008-085200 | 4/2008 |
| JP | 2009-117392 | 5/2009 |
| WO | 2008/038588 | 4/2008 |

OTHER PUBLICATIONS

Non-Final Office Action issued in U.S. Appl. No. 15/646,908 dated Sep. 18, 2019.

Final Office Action issued in U.S. Appl. No. 15/646,908 dated Mar. 19, 2020.

Notice of Allowance issued in U.S. Appl. No. 15/646,908 dated Aug. 10, 2020.

ORGANIC LIGHT-EMITTING DISPLAY APPARATUS AND METHOD OF MANUFACTURING THE SAME

CROSS-REFERENCE TO RELATED APPLICATION

This application is a divisional of U.S. patent application Ser. No. 15/646,908, filed Jul. 11, 2017 and claims priority from and the benefit of Korean Patent Application No. 10-2016-0097029, filed on Jul. 29, 2016, each of which is hereby incorporated by reference for all purposes as if fully set forth herein.

BACKGROUND

Field

Exemplary embodiments relate to an organic light-emitting display apparatus and a method of manufacturing the same.

Discussion of the Background

An organic light-emitting display ("OLED") apparatus includes a hole injection electrode, an electron injection electrode, and an organic emission layer between the hole injection electrode and the electron injection electrode. The OLED is a self-emissive display apparatus, in which holes injected from the hole injection electrode and electrons injected from the electron injection electrode recombine in the organic emission layer and extinguish to emit light. The organic light-emitting display apparatus is considered to be a next-generation display apparatus as a result of various inherent and desirable high quality characteristics, such as low power consumption, high brightness, and a fast response.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide an organic light-emitting display apparatus and a method of manufacturing the organic light-emitting display apparatus, capable of decreasing defects and reducing manufacturing cost.

Additional aspects will be set forth in the detailed description which follows and, in part, will be apparent from the disclosure, or may be learned by practice of the inventive concept.

An exemplary embodiment discloses an organic light-emitting display apparatus includes: a substrate; a plurality of first electrodes spaced apart from each other on the substrate; a plurality of organic functional layers respectively covering an upper surface and side surfaces of the plurality of first electrodes, each of the plurality of organic functional layers including an emission layer; a first bank between the plurality of organic functional layers and not directly contacting the plurality of first electrodes; and a second electrode on the plurality of organic functional layers.

The first bank may include a fluoropolymer.

The first bank may further include a photosensitive material.

Each of the plurality of organic functional layers may further include at least one functional layer from among a hole injection layer, a hole transport layer, an electron transport layer, and an electron injection layer.

The second electrode may be disposed on the plurality of organic functional layers as one body.

The organic light-emitting display apparatus may further include auxiliary electrodes between the plurality of organic functional layers and the second electrode, wherein the auxiliary electrodes may be separated and respectively arranged on the plurality of organic functional layers.

Thicknesses of at least two organic functional layers from among the plurality of organic functional layers may be different from each other.

The organic light-emitting display apparatus may further include a second bank on the first bank.

The first bank may include a fluoropolymer, and the second bank may include a photosensitive material.

The second bank may be between the plurality of organic functional layers and without directly contact the plurality of first electrodes.

An exemplary embodiment also discloses a method of manufacturing an organic light-emitting display apparatus includes: forming, on a substrate, a plurality of first electrodes spaced apart from each other; forming a first lift-off layer on the plurality of first electrodes; removing a first portion of the first lift-off layer at an area corresponding to a first group of the plurality of first electrodes, so that a second portion of the first lift-off layer remains; forming a first organic functional layer covering an upper surface and side surfaces of a first electrode corresponding to the first group and including an emission layer; removing the second portion by using a first solvent; forming a second lift-off layer on the first organic functional layer and a first electrode on which the first organic functional layer is not formed; removing a third portion of the second lift-off layer at an area corresponding to a second group of the plurality of first electrodes, so that a fourth portion of the second lift-off layer remains; forming a second organic functional layer covering an upper surface and side surfaces of a first electrode corresponding to the second group and including an emission layer; removing the fourth portion by using a second solvent; forming a first bank between the first organic functional layer and the second organic functional layer; and forming a second electrode on the first organic functional layer, the second organic functional layer, and the first bank.

Each of the first and second lift-off layers may include a fluoropolymer.

Each of the first and second lift-off layers may further include a photosensitive material.

The method may further include forming a first photoresist on the first lift-off layer, and forming a second photoresist on the second lift-off layer.

Each of the first solvent and the second solvent may include fluorine.

The first bank may include a fluoropolymer.

The method may further include applying heat to the first bank after the forming of the first bank.

The first bank may further include a photosensitive material.

A second bank including a photosensitive material may be further formed on the first bank.

Auxiliary electrodes, which are separated and respectively arranged on the first organic functional layer and the second organic functional layer, may be further formed before the second electrode is formed.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EXEMPLARY EMBODIMENTS

Figure 1:
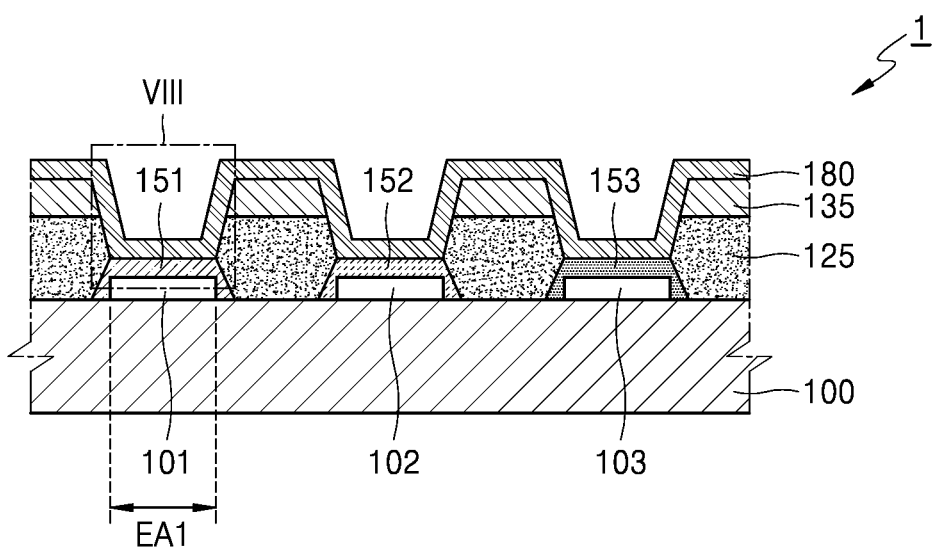
FIG. 1 is a schematic cross-sectional view of an organic light-emitting display apparatus according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular exemplary embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. The regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIG. 1 is a schematic cross-sectional view of an organic light-emitting display apparatus 1 according to an exemplary embodiment.

Referring to FIG. 1, in the organic light-emitting display apparatus 1 according to the present exemplary embodiment, a plurality of anodes including a first anode 101, a second anode 102, and a third anode 103 are spaced apart from one another on a substrate 100. First to third organic functional layers 151, 152, and 153 including emission layers are respectively arranged on the first to third anodes 101, 102, and 103, and the first to third organic functional layers 151, 152, and 153 cover an upper surface and side surfaces of the first to third anodes 101, 102, and 103, respectively. A first bank 125 that does not directly contact the first to third anodes 101, 102, and 103 is between the first to third organic functional layers 151, 152, and 153. A second bank 135 is on the first bank 125. A second electrode 180, as a common electrode, is disposed on the first to third organic functional layers 151, 152, and 153 and the second bank 135.

A method of manufacturing an organic light-emitting display apparatus according to the present exemplary embodiment and the organic light-emitting display apparatus 1 manufactured by the method will be described with reference to FIGS. 2 to 6D.

Figure 2:
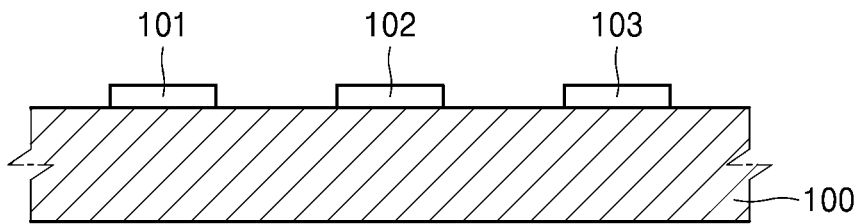
FIG. 2 is a schematic cross-sectional view of a plurality of anodes formed on a substrate of the organic light-emitting display apparatus according to an exemplary embodiment.

FIG. 2 is a schematic cross-sectional view of a plurality of anodes formed on a substrate of the organic light-emitting display apparatus 1 according to an exemplary embodiment. FIGS. 3A to 3F are schematic cross-sectional views of a first unit process of the organic light-emitting display apparatus according to the present exemplary embodiment. FIGS. 4A to 4E are schematic cross-sectional views of a second unit process of the organic light-emitting display apparatus according to the present exemplary embodiment. FIGS. 5A to 5E are schematic cross-sectional views of a third unit process of the organic light-emitting display apparatus according to the present exemplary embodiment. FIGS. 6A to 6D are schematic cross-sectional views of a bank formation process of the organic light-emitting display apparatus according to the present exemplary embodiment.

Referring to FIG. 2, a plurality of anodes including the first anode 101, the second anode 102, and the third anode 103 are formed on the substrate 100.

The substrate 100 may include various materials. For example, the substrate 100 may include glass or plastic. The plastic may include a material having excellent heat resistance and durability, such as polyimide, polyethylene naphthalate, polyethylene terephthalate, polyarylate, polycarbonate, polyetherimide, or polyethersulfone.

Although not illustrated in FIG. 2, a buffer layer (not shown) for forming a flat surface on the substrate 100 and preventing impure elements from infiltrating into the substrate 100 may further be formed. The buffer layer (not shown) may be a single layer or a plurality of layers including silicon nitride and/or silicon oxide.

The first to third anodes 101, 102, and 103 are hole injection electrodes and may include a material having a high work function. The first to third anodes 101, 102, and 103 may each include at least one selected from the group including indium tin oxide, indium zinc oxide, zinc oxide, indium oxide, indium gallium oxide, and aluminum zinc oxide.

Although not illustrated in FIG. 2, the first to third anodes 101, 102, and 103 may respectively be electrically connected to first to third thin film transistors (not shown) that are arranged between the substrate 100 and the first to third anodes 101, 102, and 103.

Figure 3A:
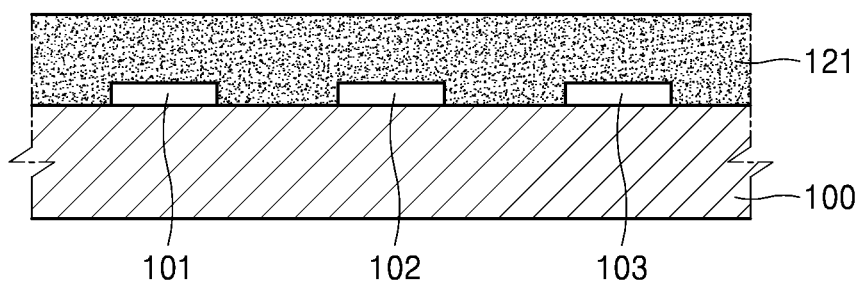
FIG. 3A, FIG. 3B, FIG. 3C, FIG. 3D, FIG. 3E, and FIG. 3F are schematic cross-sectional views of a first unit process of the organic light-emitting display apparatus according to an exemplary embodiment.

Referring to FIG. 3A, a first lift-off layer 121 including a fluoropolymer is formed on the substrate 100 on which the first to third anodes 101, 102, and 103 are formed.

The fluoropolymer included in the first lift-off layer 121 may include a polymer containing about 20 wt % to about 60 wt % of fluorine. For example, the fluoropolymer included in the first lift-off layer 121 may include at least one of polytetrafluoroethylene, polychlorotrifluoroethylene, polydichlorodifluoroethylene, a copolymer of chlorotrifluoroethylene and dichlorodifluoroethylene, a copolymer of tetrafluoroethylene and perfluoroalkylvinylether, a copolymer of chlorotrifluoroethylene and perfluoroalkylvinylether, a copolymer of tetrafluoroethylene and perfluoroalkylvinylether, and a copolymer of chlorotrifluoroethylene and perfluoroalkylvinylether.

The first lift-off layer 121 may be formed on the substrate 100 by using an application method, a printing method, a deposition method, or the like. When the first lift-off layer 121 is formed by the application method or the printing method, a process of forming a photoresist may be performed after performing a hardening process and a polymerization process, if necessary.

A thickness of the first lift-off layer 121 may be about 0.2 µm to about 5 µm. If the first lift-off layer 121 is too thick, a time taken to melt the first lift-off layer 121 for patterning increases, and thus, time taken for a manufacturing process may increase. If the first lift-off layer 121 is too thin, it may be difficult to lift off the first lift-off layer 121.

The first lift-off layer 121 may further include a moisture absorbent. The moisture absorbent may include various materials. The moisture absorbent is a compound, such as calcium oxide, barium oxide, aluminum oxide, magnesium oxide, etc., in which metal atoms are connected via oxygen, and may include a material that reacts with water to form a metal hydroxide. Also, the moisture absorbent may include one selected from the group including a metal halide, an inorganic acid salt of metal, an organic acid salt, a porous inorganic compound, and a combination thereof. The moisture absorbent may include an acryl-based organic material, a methacryl-based organic material, a polyisoprene-based organic material, a vinyl-based organic material, an epoxy-based organic material, a urethane-based organic material, a cellulose-based organic material, or the like. The moisture absorbent may include a titania-based inorganic material, a silicon oxide-based inorganic material, a zirconia-based inorganic material, an alumina-based inorganic material, or the like. The moisture absorbent may include a sealant made of epoxy silane, vinyl silane, aminosilane, or methacrylate silane. The moisture absorbent may capture moisture generated during the first unit process and prevent degradation of the first organic functional layer 151 formed during the first unit process.

Figure 3B:
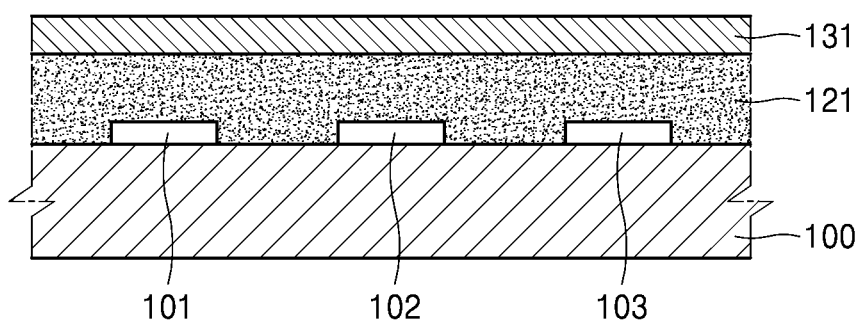

Referring to FIG. 3B, first photoresist 131 is formed on the first lift-off layer 121. The first photoresist 131 may be exposed and developed by using a first photomask (not shown). The first photoresist 131 may be a positive-type photoresist or a negative-type photoresist. In the present exemplary embodiment, the positive-type photoresist will be described as an example.

Figure 3C:
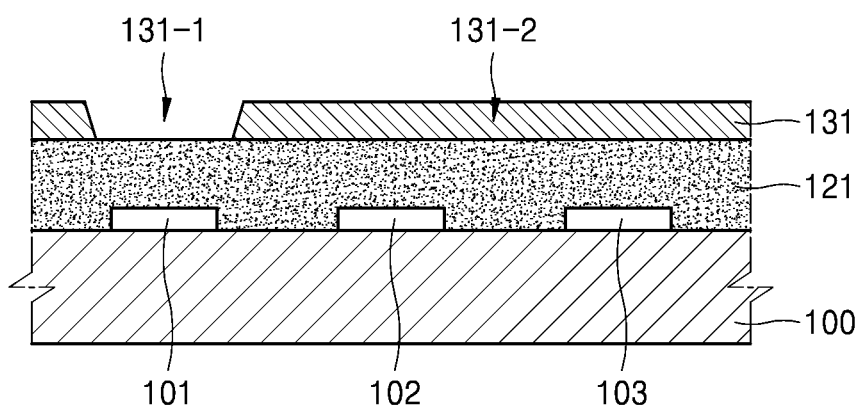

Referring to FIG. 3C, the first photoresist 131 has a patterned shape. A first portion 131-1 that is a location corresponding to the first anode 101 is removed from the exposed and developed first photoresist 131, and a second portion 131-2 that is an area outside the first portion 131-1 remains.

Figure 3D:
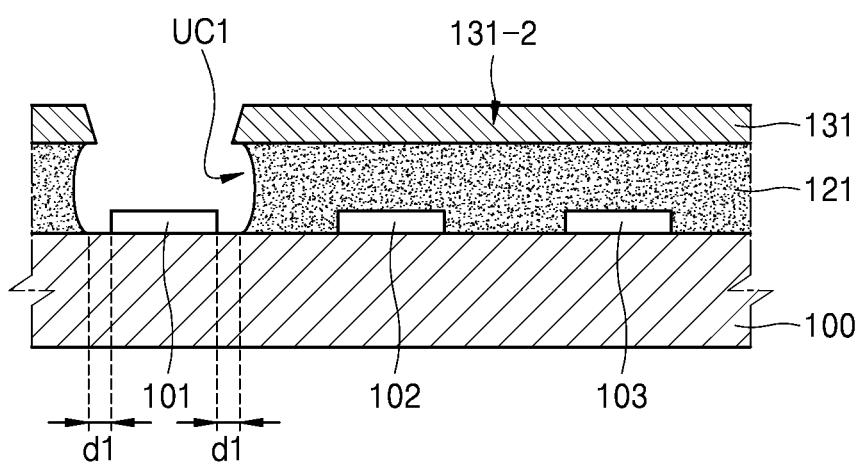

Referring to FIG. 3D, the first lift-off layer 121 is etched by using a pattern of the first photoresist 131 of FIG. 3C as an etching mask.

Because the first lift-off layer 121 includes the fluoropolymer, a solvent capable of etching the fluoropolymer is used as an etchant.

A first solvent (not shown) including fluorine may be used as the etchant. The first solvent may include hydrofluoroether. The hydrofluoroether has low reactivity with another material, and thus is electrochemically stable. Also, the hydrofluoroether has a low global warming factor and low toxicity, and thus is environmentally stable.

A portion of the first lift-off layer 121 formed in a location corresponding to the first portion 131-1, that is, on the first anode 101, is etched by an etching process. The first lift-off layer 121 is etched such that a first undercut profile UC1 is formed under a boundary surface with the first portion 131-1 of the first photoresist 131, and so that the first lift-off layer 121 is spaced apart from a side surface of the first anode 101 by a predetermined distance d1. The first undercut profile UC1 allows an elaborate deposition pattern of the first organic functional layer 151 to be formed during a deposition process that will be described later, and allows the first organic functional layer 151 to cover an end of the first anode 101.

Figure 3E:
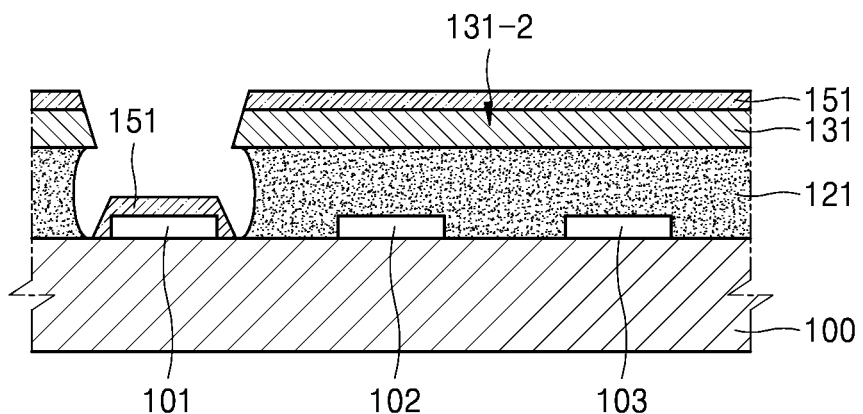

Referring to FIG. 3E, the first organic functional layer 151 is formed on a structure of FIG. 3D.

The first organic functional layer 151 includes a first organic emission layer. Also, the first organic functional layer 151 may further include at least one functional layer from among a hole injection layer, a hole transport layer, an electron transport layer, and an electron injection layer.

In a deposition process, the first organic functional layer 151 may be formed by vacuum deposition. In the deposition process, the first lift-off layer 121 and the first photoresist 131 serve as a deposition mask. A portion of the first organic functional layer 151 is formed so as to cover an upper surface and side surfaces of the first anode 101. In addition, another portion of the first organic functional layer 151 is formed on the second portion 131-2, which is the remaining portion of the first photoresist 131 excluding the first portion 131-1.

Figure 3F:
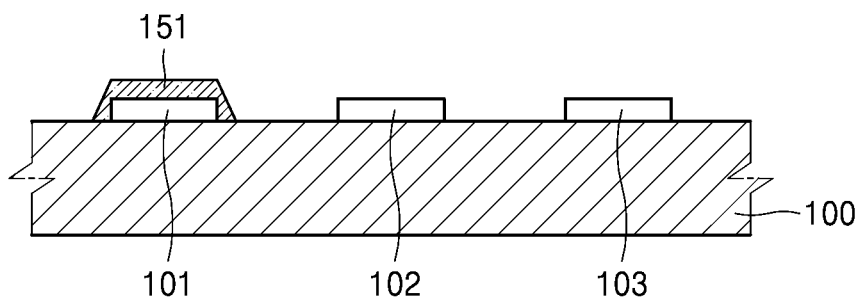

Referring to FIG. 3F, a lift-off process is performed on a structure of FIG. 3E.

Because the first lift-off layer 121 includes the fluoropolymer, a second solvent including fluorine is used in the lift-off process. The lift-off process is performed after the first organic functional layer 151 is formed, and accordingly, a material having low reactivity with the first organic functional layer 151 may be used as the second solvent. As in the first solvent, the second solvent may include hydrofluoroether.

By lifting off the first lift-off layer 121 formed under the second portion 131-2 of the first photoresist 131, the first organic functional layer 151 formed on the second portion 131-2 of the first photoresist 131 is removed, and the first organic functional layer 151 formed on the upper surface and the side surfaces of the first anode 101 remains as a pattern.

According to the present exemplary embodiment, a pattern of the first organic functional layer 151 is formed by a first lift-off process instead of by deposition using a metal mask (not shown), and accordingly, misalignment of the substrate 100 with the metal mask (not shown) may be prevented.

After the first unit process is performed, the second unit process is performed in which the second organic functional layer 152 (refer to FIG. 4E) emitting color different from that of the first organic functional layer 151 is formed in an area where the second anode 102 is located. Hereinafter, the second unit process will be described with reference to FIGS. 4A to 4E.

Figure 4A:
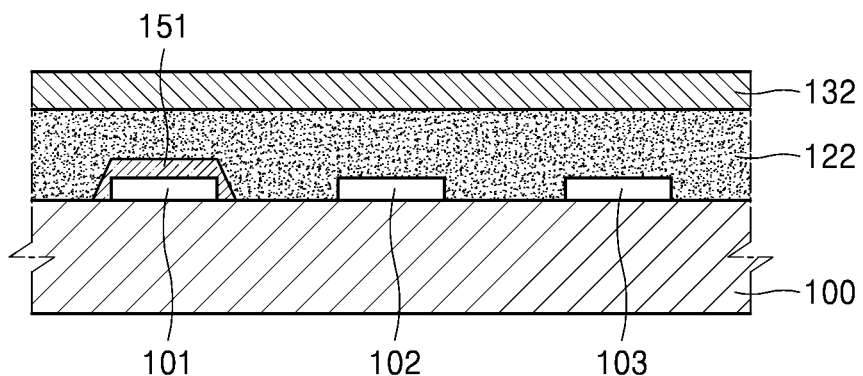
FIG. 4A, FIG. 4B, FIG. 4C, FIG. 4D, and FIG. 4E are schematic cross-sectional views of a second unit process of the organic light-emitting display apparatus according to an exemplary embodiment.

Referring to FIG. 4A, a second lift-off layer 122 including a fluoropolymer is formed on the substrate 100 on which the first to third anodes 101, 102, and 103 and the first organic functional layer 151 are formed. The second lift-off layer 122 may be formed by using an application method, a printing method, a deposition method, or the like. The second lift-off layer 122 may include the same material as that of the first lift-off layer 121.

Second photoresist 132 is formed on the second lift-off layer 122. The second photoresist 132 may be exposed and developed by using a second photomask (not shown). The second photoresist 132 may be a positive-type photoresist or a negative-type photoresist. In the present exemplary embodiment, the positive-type photoresist will be described as an example.

Figure 4B:
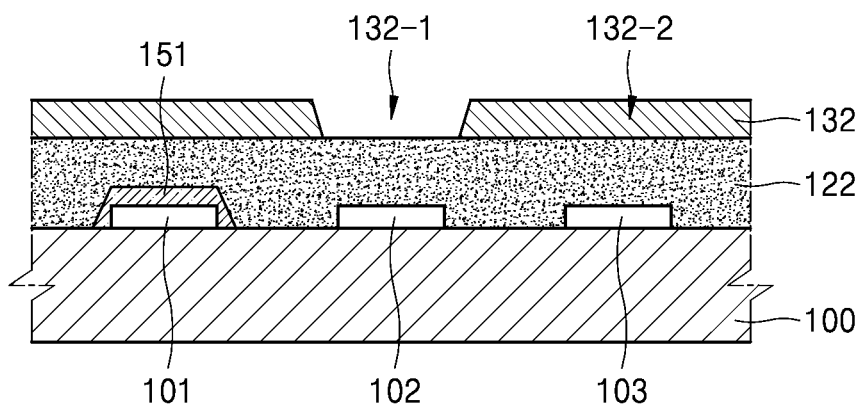

Referring to FIG. 4B, the second photoresist 132 has a patterned shape. A first portion 132-1 that is a location corresponding to the second anode 102 is removed from the exposed and developed second photoresist 132, and a second portion 132-2 that is an area outside the first portion 132-1 remains.

Figure 4C:
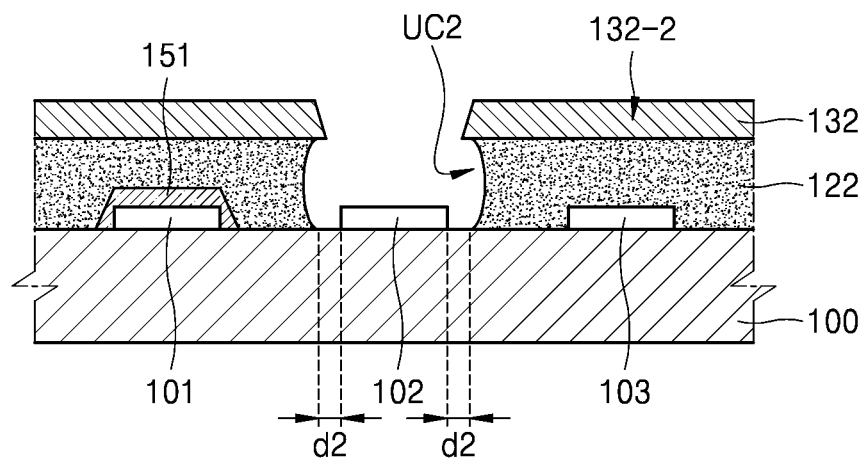

Referring to FIG. 4C, the second lift-off layer 122 is etched by using a pattern of the second photoresist 132 of FIG. 4B as an etching mask.

Because the second lift-off layer 122 includes the fluoropolymer, a solvent capable of etching the fluoropolymer is used as an etchant.

A first solvent (not shown) including fluorine may be used as the etchant. As in the first unit process, the first solvent may include hydrofluoroether. The hydrofluoroether has low reactivity with another material, and thus is electrochemically stable. Also, the hydrofluoroether has a low global warming factor and low toxicity, and thus is environmentally stable. In some exemplary embodiments, the first solvent may include a material different from that used in the first unit process.

A portion of the second lift-off layer 122 formed in a location corresponding to the first portion 132-1, that is, on the second anode 102, is etched by an etching process. The second lift-off layer 122 is etched such that a second undercut profile UC2 is formed under a boundary surface with the first portion 132-1 of the second photoresist 132, and so that the second life-off layer 122 is spaced apart from a side surface of the second anode 102 by a predetermined distance d2. The second undercut profile UC2 allows an elaborate deposition pattern of the second organic functional layer 152 to be formed during a deposition process that will be described later.

Figure 4D:
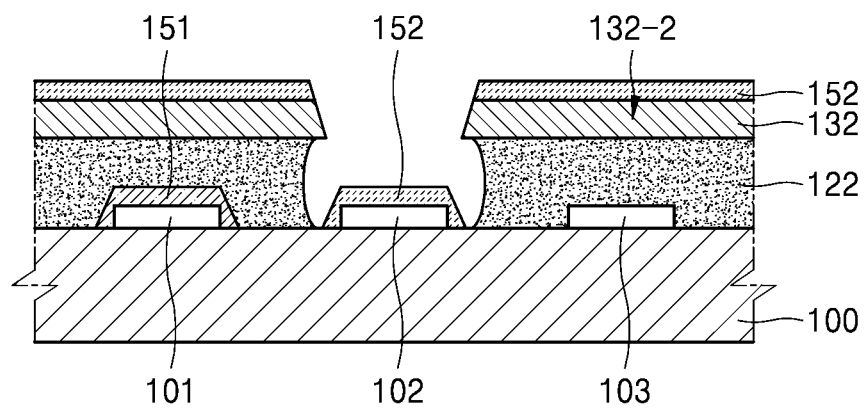

Referring to FIG. 4D, the second organic functional layer 152 is formed on a structure of FIG. 4C.

The second organic functional layer 152 includes a second organic emission layer. Also, the second organic functional layer 152 may further include at least one functional layer from among a hole injection layer, a hole transport layer, an electron transport layer, and an electron injection layer.

In a deposition process, the second organic functional layer 152 may be formed by vacuum deposition. In the deposition process, the second lift-off layer 122 and the second photoresist 132 serve as a deposition mask. A portion of the second organic functional layer 152 is formed so as to cover an upper surface and side surfaces of the second anode 102. In addition, another portion of the second organic functional layer 152 is formed on the second portion 132-2, which is the remaining portion of the second photoresist 132 excluding the first portion 132-1.

Figure 4E:
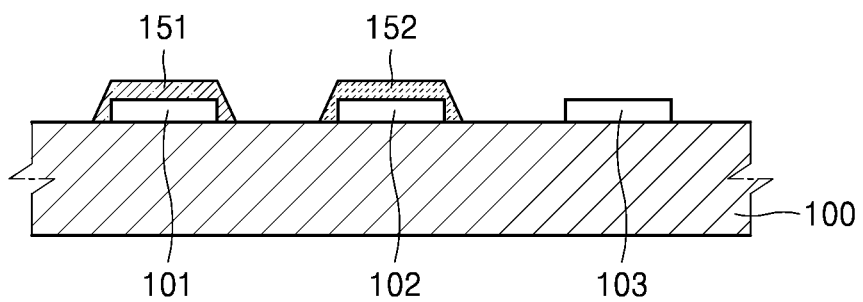

Referring to FIG. 4E, a lift-off process is performed on a structure of FIG. 4D.

Because the second lift-off layer 122 includes the fluoropolymer, a second solvent including fluorine is used in the lift-off process. The lift-off process is performed after the second organic functional layer 152 is formed, and accordingly, a material having low reactivity with the second organic functional layer 152 may be used as the second solvent. As in the first solvent, the second solvent may include hydrofluoroether.

By lifting off the second lift-off layer 122 formed under the second portion 132-2 of the second photoresist 132, the second organic functional layer 152 formed on the second portion 132-2 of the second photoresist 132 is removed, and the second organic functional layer 152 formed on the upper surface and the side surfaces of the second anode 102 remains as a pattern.

After the second unit process is performed, the third unit process is performed in which the third organic functional layer 153 (refer to FIG. 5E) emitting color different from those of the first organic functional layer 151 and the second organic functional layer 152 is formed in an area where the third anode 103 is located. Hereinafter, the third unit process will be described with reference to FIGS. 5A to 5E.

Figure 5A:
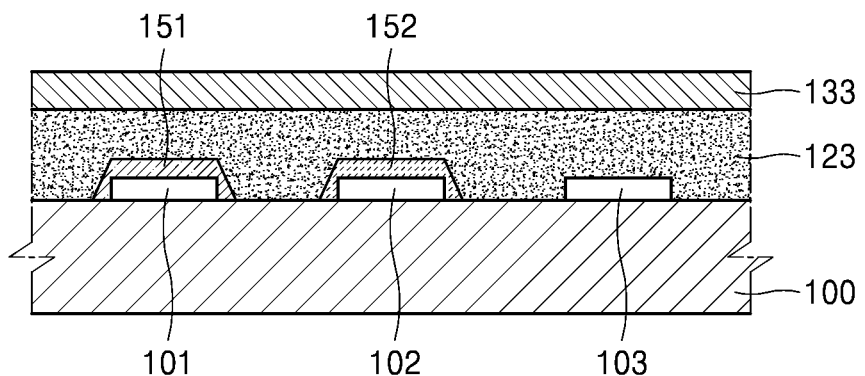
FIG. 5A, FIG. 5B, FIG. 5C, FIG. 5D, and FIG. 5E are schematic cross-sectional views of a third unit process of the organic light-emitting display apparatus according to an exemplary embodiment.

Referring to FIG. 5A, a third lift-off layer 123 including a fluoropolymer is formed on the substrate 100 on which the first to third anodes 101, 102, and 103 and the first and second organic functional layers 151 and 152 are formed. The third lift-off layer 123 may be formed by using an application method, a printing method, a deposition method, or the like. The third lift-off layer 123 may include the same material as that of the first and/or second lift-off layers 121 and 122.

Third photoresist 133 is formed on the third lift-off layer 123. The third photoresist 133 may be exposed and developed by using a third photomask (not shown). The third photoresist 133 may be a positive-type photoresist or a negative-type photoresist. In the present exemplary embodiment, the positive-type photoresist will be described as an example.

Figure 5B:
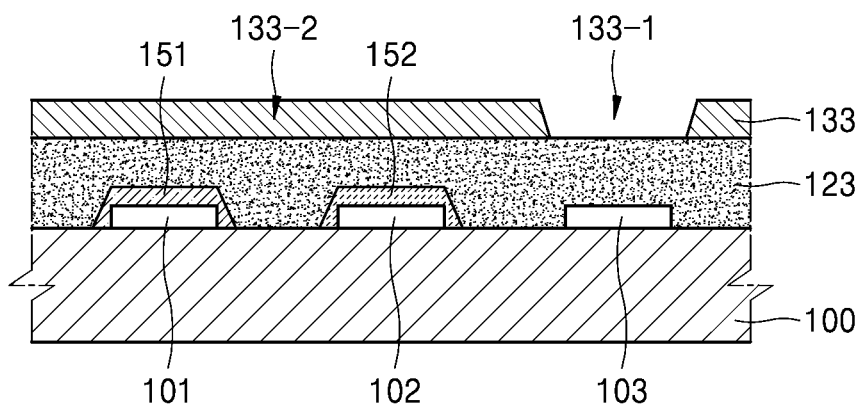

Referring to FIG. 5B, the third photoresist 133 has a patterned shape. A first portion 133-1 that is a location corresponding to the third anode 103 is removed from the exposed and developed third photoresist 133, and a second portion 133-2 that is an area outside the first portion 133-1 remains.

Figure 5C:
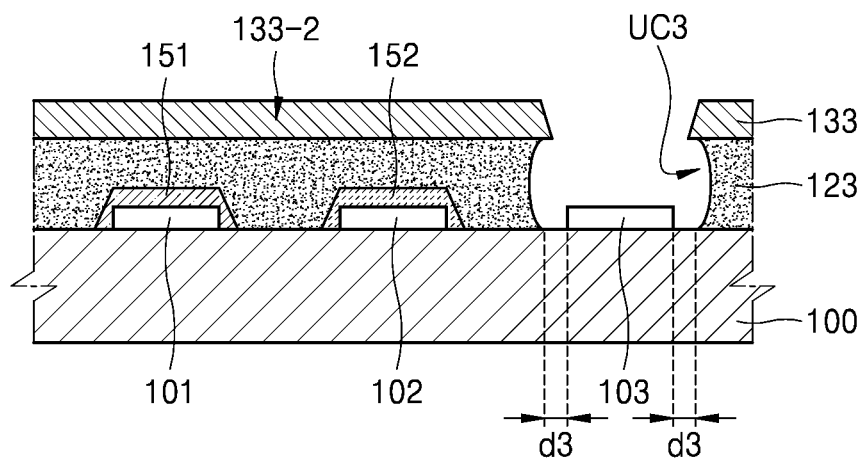

Referring to FIG. 5C, the third lift-off layer 123 is etched by using a pattern of the third photoresist 133 of FIG. 5B as an etching mask.

Because the third lift-off layer 123 includes the fluoropolymer, a solvent capable of etching the fluoropolymer is used as an etchant.

A first solvent (not shown) including fluorine may be used as the etchant. As in the first and second unit processes, the first solvent may include hydrofluoroether. The hydrofluoroether has low reactivity with another material, and thus is electrochemically stable. Also, the hydrofluoroether has a low global warming factor and low toxicity, and thus is environmentally stable. In some exemplary embodiments, the first solvent may include a material different from that used in the first and second unit processes.

A portion of the third lift-off layer 123 formed in a location corresponding to the first portion 133-1, that is, on the third anode 103, is etched by an etching process. The third lift-off layer 123 is etched such that a third undercut profile UC3 is formed under a boundary surface with the first portion 133-1 of the third photoresist 133, and so that the third lift-off layer 123 is spaced apart from a side surface of the third anode 103 by a predetermined distance d3. The third undercut profile UC3 allows an elaborate deposition pattern of the third organic functional layer 153 to be formed during a deposition process that will be described later.

Figure 5D:
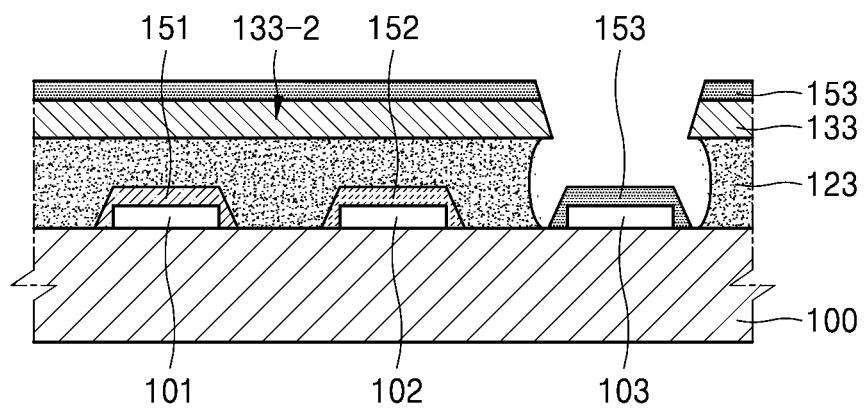

Referring to FIG. 5D, the third organic functional layer 153 is formed on a structure of FIG. 5C.

The third organic functional layer 153 includes a third organic emission layer. Also, the third organic functional layer 153 may further include at least one functional layer from among a hole injection layer, a hole transport layer, an electron transport layer, and an electron injection layer.

In a deposition process, the third organic functional layer 153 may be formed by vacuum deposition. In the deposition process, the third lift-off layer 123 and the third photoresist 133 serve as a deposition mask. A portion of the third organic functional layer 153 is formed so as to cover an upper surface and side surfaces of the third anode 103. In addition, another portion of the third organic functional layer 153 is formed on the second portion 133-2, which is the remaining portion of the third photoresist 133 excluding the first portion 133-1.

Figure 5E:
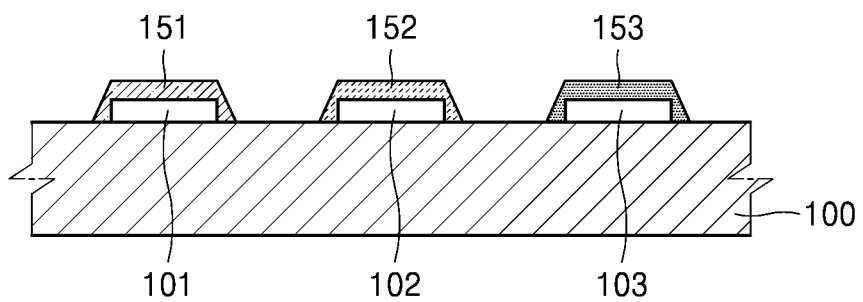

Referring to FIG. 5E, a lift-off process is performed on a structure of FIG. 5D.

Because the third lift-off layer 123 includes the fluoropolymer, a second solvent including fluorine is used in the lift-off process. The lift-off process is performed after the third organic functional layer 153 is formed, and accordingly, a material having low reactivity with the third organic functional layer 153 may be used as the second solvent. As in the first solvent, the second solvent may include hydrofluoroether.

By lifting off the third lift-off layer 123 formed under the second portion 133-2 of the third photoresist 133, the third organic functional layer 153 formed on the second portion 133-2 of the third photoresist 133 is removed, and the third organic functional layer 153 formed on the upper surface and the side surfaces of the third anode 103 remains as a pattern.

The first to third organic functional layers 151, 152, and 153 may respectively emit different colors of light. Light emitted from the first to third organic functional layers 151, 152, and 153 may be mixed to form white light. For example, the first to third organic functional layers 151, 152, and 153 may respectively emit red light, green light, and blue light. For example, the first to third organic functional layers 151, 152, and 153 may be configurations of sub-pixels constituting a unit pixel of the organic light-emitting display apparatus 1.

Also, the organic light-emitting display apparatus 1 of FIG. 1 may represent one unit pixel. Also, the present exemplary embodiment may be applied to an organic light-emitting display apparatus including the unit pixel of FIG. 1 as a plurality. That is, a plurality of first organic functional layers 151 each emitting first light may be simultaneously formed by the first unit process, a plurality of second organic functional layers 152 each emitting second light may be simultaneously formed by the second unit process, and a plurality of third organic functional layers 153 each emitting third light may be simultaneously formed by the third unit process. Through the first to third unit processes, full color may be implemented.

After the first to third organic functional layers 151, 152, and 153 are formed by the first to third unit processes, a bank serving as a pixel-defining layer is formed. Hereinafter, the bank formation process of the organic light-emitting display apparatus 1 according to the present exemplary embodiment will be described with reference to FIGS. 6A to 6D.

Figure 6A:
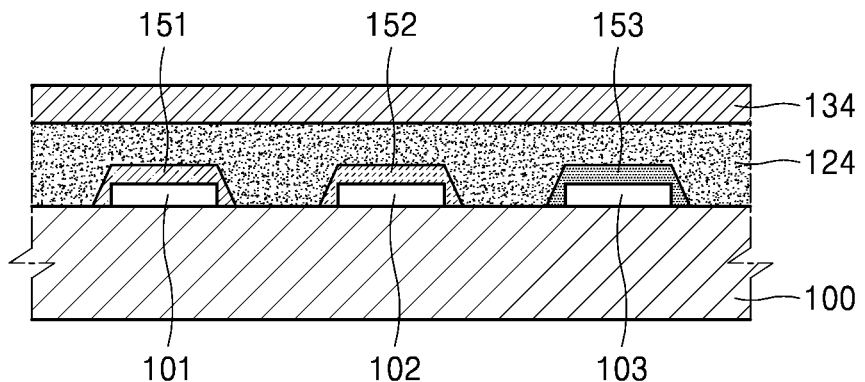
FIG. 6A, FIG. 6B, FIG. 6C, and FIG. 6D are schematic cross-sectional views of a bank formation process of the organic light-emitting display apparatus according to an exemplary embodiment.

Referring to FIG. 6A, a fourth lift-off layer 124 including a fluoropolymer is formed on the substrate 100 on which the first to third organic functional layers 151, 152, and 153 covering the upper surface and the side surfaces of the first to third anodes 101, 102, and 103, respectively, are formed. The fourth lift-off layer 124 may be formed by using an application method, a printing method, a deposition method, or the like. The fourth lift-off layer 124 may include the same material as that of the first to third lift-off layers 121, 122, and 123.

Fourth photoresist 134 is formed on the fourth lift-off layer 124. The fourth photoresist 134 may be exposed and developed by using a fourth photomask (not shown). The fourth photoresist 134 may be a positive-type photoresist or a negative-type photoresist. In the present exemplary embodiment, the positive-type photoresist will be described as an example.

Figure 6B:
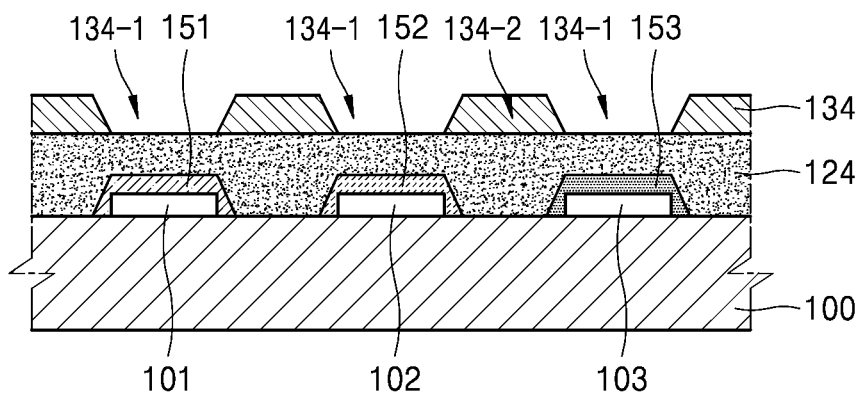

Referring to FIG. 6B, the fourth photoresist 134 has a patterned shape. First portions 134-1 that are locations respectively corresponding to the first to third organic functional layers 151, 152, and 153 are simultaneously removed from the exposed and developed fourth photoresist 134, and a second portion 134-2 that is an area outside the first portions 134-1 remains.

Figure 6C:
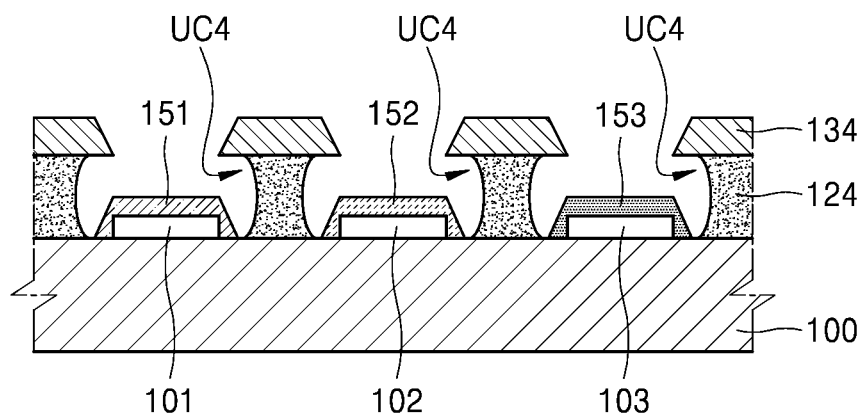

Referring to FIG. 6C, the fourth lift-off layer 124 is etched by using a pattern of the fourth photoresist 134 of FIG. 6B as an etching mask.

Because the fourth lift-off layer 124 includes the fluoropolymer, a solvent capable of etching the fluoropolymer is used as an etchant.

A first solvent (not shown) including fluorine may be used as the etchant. As in the first to third unit processes, the first solvent may include hydrofluoroether. In some exemplary embodiments, the first solvent may include a material different from that used in the first to third unit processes.

Portions of the fourth lift-off layer 124 formed in locations corresponding to the first portions 134-1, that is, on the first to third organic functional layers 151, 152 and 153, are etched by an etching process. The fourth lift-off layer 124 is etched to form fourth undercut profiles UC4 under a boundary surface with the first portions 134-1 of the fourth photoresist 134, and so that the fourth lift-off layer 124 is not spaced apart from side surfaces of the first to third organic functional layers 151, 152, and 153.

Figure 6D:
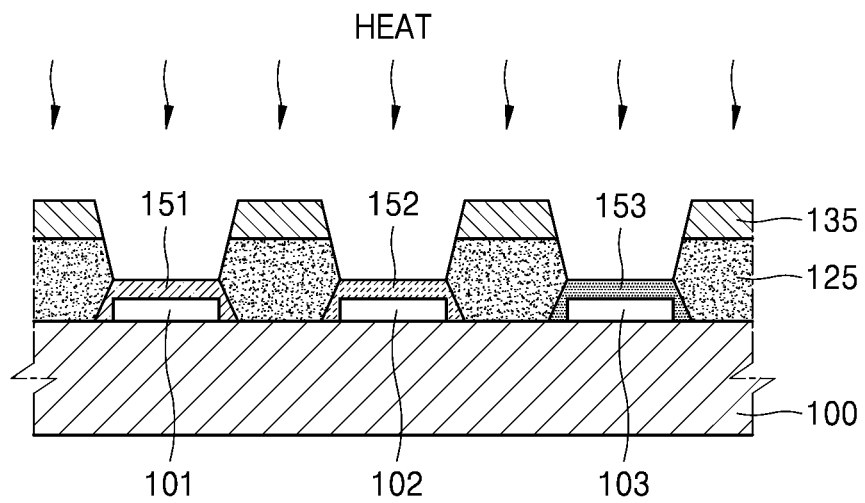

Referring to FIG. 6D, after the fourth lift-off layer 124 has been patterned as a result of the process of FIG. 6C, a process of applying heat to the fourth lift-off layer 124 and the fourth photoresist 134 is performed.

When heat of about 70° C. or greater is applied in order to restructure the fourth lift-off layer 124 including fluorine, the fourth lift-off layer 124 is melted down, and a shape of the fourth lift-off layer 124 is changed to cover respective side surfaces of the first to third organic functional layers 151, 152, and 153. The fourth lift-off layer 124 having a changed shape forms the first bank 125, and the fourth photoresist 134 having a changed shape forms the second bank 135.

Referring to FIG. 1 again, a cathode 180 is formed on a structure of FIG. 6D. The cathode 180 may be integrally formed on the first to third organic functional layers 151, 152, and 153 and the second bank 135 as a common electrode.

The first to third anodes 101, 102, and 103 have sharp ends, and accordingly, when a current is applied after the cathode 180 is formed, an electric field may be focused to the ends, and thus, a short circuit may arise during driving. However, in the present exemplary embodiment, the first to third organic functional layers 151, 152, and 153 cover ends of the first to third anodes 101, 102, and 103, and the first bank 125 covers the ends of the first to third anodes 101, 102, and 103 again, thereby alleviating the phenomenon in which an electric field is focused to the ends.

Also, ends of the first to third organic functional layers 151, 152, and 153 may each be covered and protected by the first bank 125 and the second bank 135, and thus, degradation of the first to third organic functional layers 151, 152, and 153 may be alleviated.

According to the present exemplary embodiment, an aperture ratio of a display apparatus may be increased because the first and second banks 125 and 135 corresponding to a pixel-defining layer are formed after the first to third organic functional layers 151, 152, and 153 are formed.

FIGS. 7A to 7E are schematic cross-sectional views of manufacturing processes of an organic light-emitting display apparatus 2 according to a comparative example.

Figure 7A:
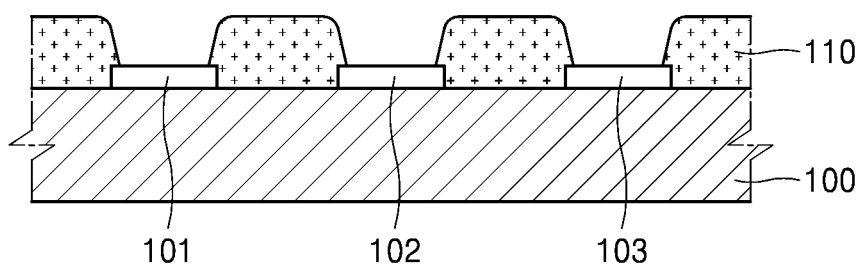
FIG. 7A, FIG. 7B, FIG. 7C, FIG. 7D, and FIG. 7E are schematic cross-sectional views of manufacturing processes of an organic light-emitting display apparatus according to a comparative example.

Referring to FIG. 7A, a pixel-defining layer 110 is formed so as to cover ends of the first to third anodes 101, 102, and 103 which are separated from one another on the substrate 100. In the comparative example, the pixel-defining layer 110 serves as the first and second banks 125 and 135 of the previous exemplary embodiment. That is, by covering the ends of the first to third anodes 101, 102, and 103, an electric field may be prevented from being focused to the ends.

Figure 7B:
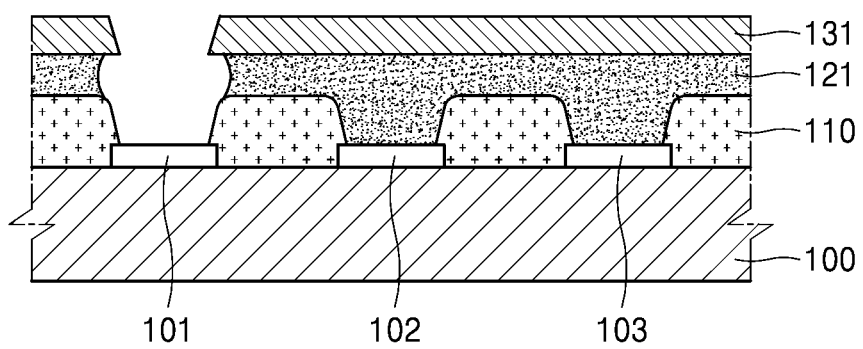

Referring to FIG. 7B, the first lift-off layer 121 and the first photoresist 131 are formed on a structure of FIG. 7A in this stated order. Portions of the first lift-off layer 121 and the first photoresist 131 which correspond to the first anode 101 are removed.

Figure 7C:
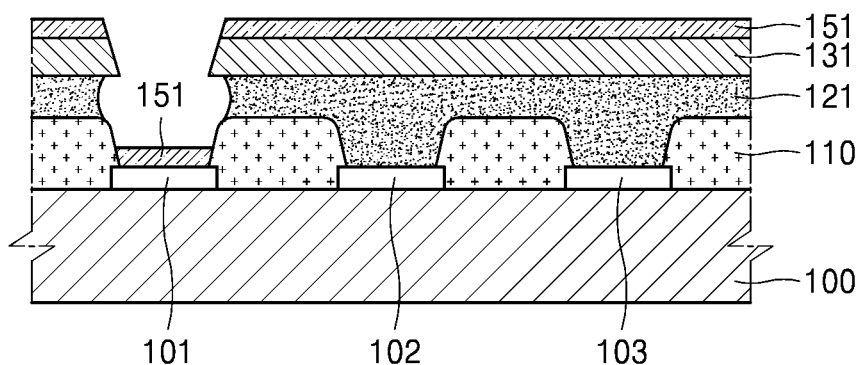
Figure 7D:
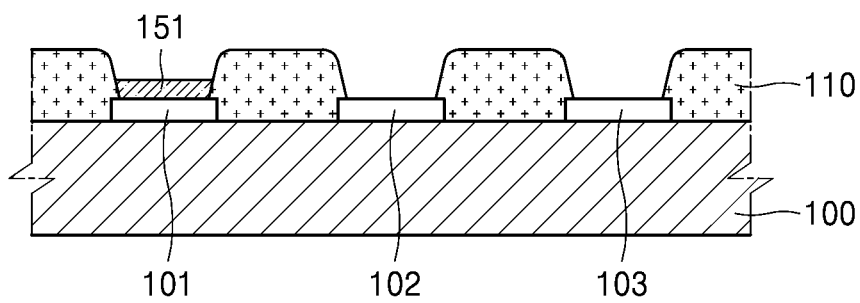

Referring to FIG. 7C, the first organic functional layer 151 is formed on a structure of FIG. 7B. Referring to FIG. 7D, a lift-off process is performed to complete a first unit process that allows the first organic functional layer 151 to remain on the first anode 101. Although descriptions of second and third unit processes of the comparative example are omitted, the second unit process that allows a second organic functional layer to remain on the second anode 102 and the third unit process that allows a third organic functional layer to remain on the third anode 103 are performed.

Figure 7E:
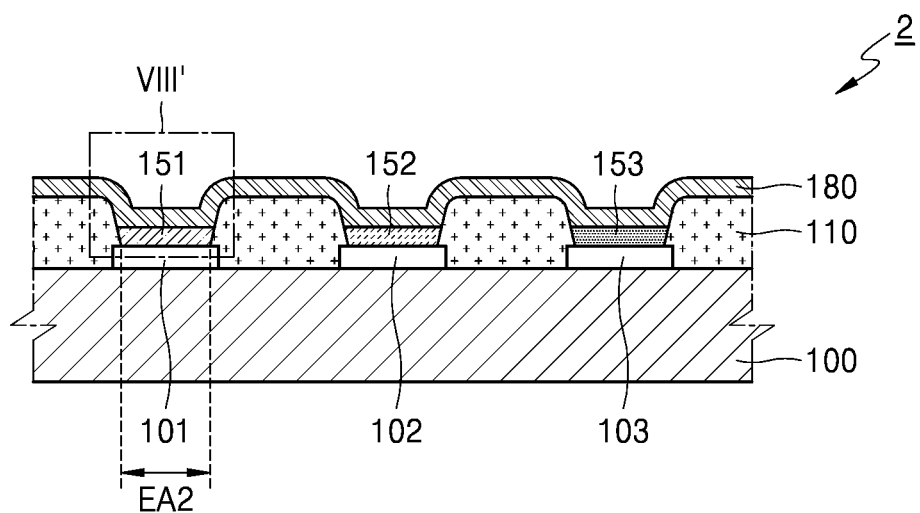

FIG. 7E is a schematic cross-sectional view of the organic light-emitting display apparatus 2 according to the comparative example, in which the first to third unit processes have been completed.

Referring to FIG. 7E, in the organic light-emitting display apparatus 2 according to the comparative example, the ends of the first to third anodes 101, 102, and 103 are covered by the pixel-defining layer 110, and the cathode 180, which is a common electrode, is on the pixel-defining layer 110.

Figure 8:
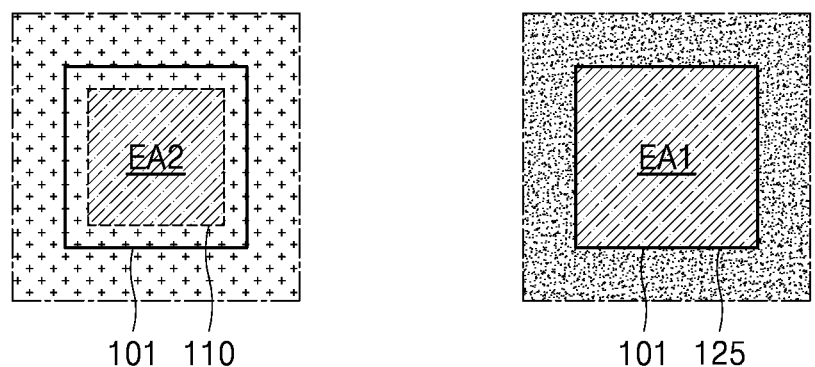
FIG. 8 illustrates, for comparison, sizes of emission areas of the organic light-emitting display apparatus according to the exemplary embodiment and the organic light-emitting display apparatus according to the comparative example.

Referring to FIG. 8, in the organic light-emitting display apparatus 2 according to the comparative example, an end of the first anode 101 is covered by the pixel-defining layer 110, and then, the first organic functional layer 151 is formed. Accordingly, an emission area EA2 is defined as an area not covered by the first anode 101 and the pixel-defining layer 110.

However, in the organic light-emitting display apparatus 1 according to the present exemplary embodiment, an end of the first anode 101 is covered by the first organic functional layer 151, and is not covered by the first bank 125. Accordingly, an emission area EA1 is increased relative to the emission area EA2 of the comparative example. That is, according to the present exemplary embodiment, an aperture ratio of a display apparatus may be increased.

Figure 9:
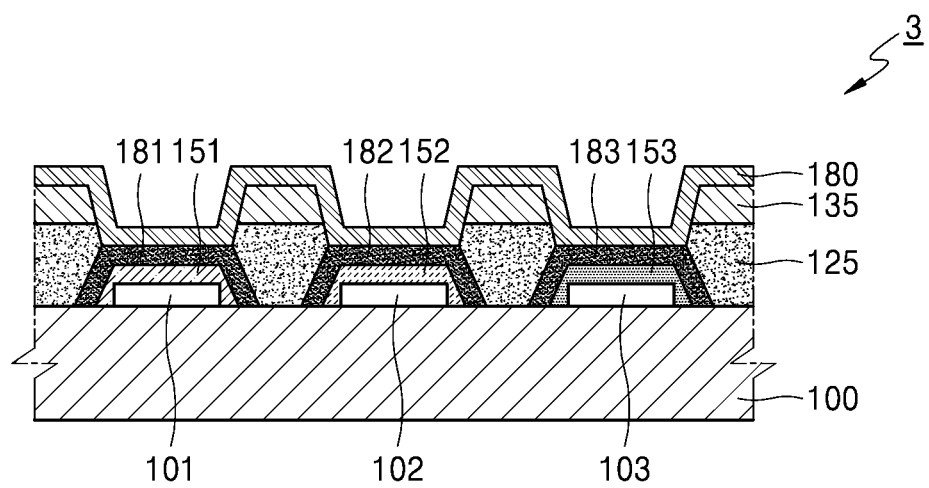
FIG. 9 is a schematic cross-sectional view of an organic light-emitting display apparatus according to another exemplary embodiment.

FIG. 9 is a schematic cross-sectional view of an organic light-emitting display apparatus 3 according to another exemplary embodiment.

The organic light-emitting display apparatus 3 of FIG. 9 further includes first to third auxiliary cathodes 181, 182, and 183 in addition to configurations of the organic light-emitting display apparatus 1.

The first to third auxiliary cathodes 181, 182, and 183 are located between the first to third organic functional layers 151, 152, and 153 and the cathode 180, and may be respectively formed on the first organic functional layer 151 of FIG. 3E, the second organic functional layer 152 of FIG. 4D, and the third organic functional layer 153 of FIG. 5D.

The first to third auxiliary cathodes 181, 182, and 183 may include a material having low resistance relative to that of the cathode 180, and thus, total resistance of the first to third auxiliary cathodes 181, 182, and 183 and the cathode 180 may decrease, thereby decreasing a voltage drop due to the total resistance of the cathodes.

In the present exemplary embodiment, the first to third anodes 101, 102, and 103 are described as hole injection electrodes, and the first to third auxiliary cathodes 181, 182, and 183 and the cathode 180 are described as electron injection electrodes. However, this is an example, and an electron injection electrode may be formed in an area where the first to third anodes 101, 102, and 103 are located, and a hole injection electrode may be formed in an area where the first to third auxiliary cathodes 181, 182, and 183 and the cathode 180 are located.

Figure 10:
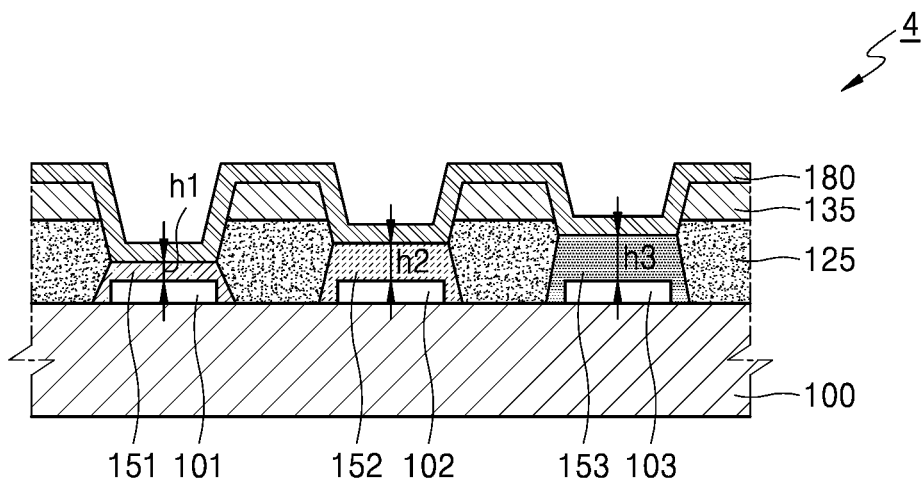
FIG. 10 is a schematic cross-sectional view of an organic light-emitting display apparatus according to another exemplary embodiment.

FIG. 10 is a schematic cross-sectional view of an organic light-emitting display apparatus 4 according to another exemplary embodiment.

The organic light-emitting display apparatus 4 of FIG. 10 differs from the organic light-emitting display apparatus 1 in that a thickness h1 of a first organic functional layer, a thickness h2 of a second organic functional layer, and a thickness h3 of a third organic functional layer are different from one another. That is, an optical resonance structure is employed in which an optical length of each wavelength emitted from an emission layer of each of the first to third organic functional layers 151, 152, and 153 changes. The optical resonance structure may be employed to increase light efficiency of the organic light-emitting display apparatus 4.

Figure 11:
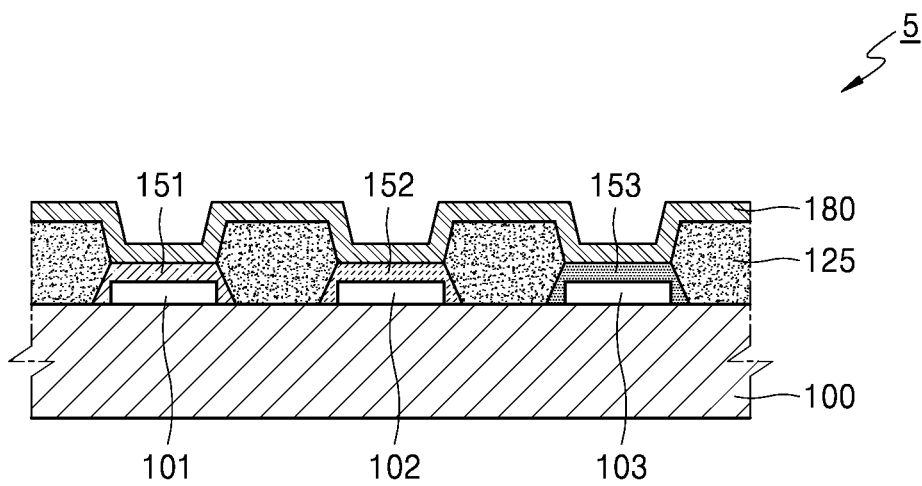
FIG. 11 is a schematic cross-sectional view of an organic light-emitting display apparatus according to another exemplary embodiment.

FIG. 11 is a schematic cross-sectional view of an organic light-emitting display apparatus 5 according to another exemplary embodiment.

The organic light-emitting display apparatus 5 of FIG. 11 differs from the organic light-emitting display apparatus 1 in that the second bank 135 of FIG. 1 is omitted. That is, in the organic light-emitting display apparatus 5 according to the present exemplary embodiment, only the first bank 125 serves as a pixel-defining layer. To this end, the first bank 125 may further include a photosensitive material in addition to a fluoropolymer. Processes are performed without formation of the second bank 135, and thus may be simplified.

Although not illustrated in the above-described drawings, the above organic light-emitting display apparatuses may further include an encapsulation member encapsulating an organic emission layer. The encapsulation member may be a glass substrate, metal foil, a thin film encapsulation layer including an inorganic layer and an organic layer mixed with each other, etc.

As described above, according to one or more exemplary embodiments, an emission layer is formed without using a fine metal mask ("FMM"), and accordingly, manufacturing processes may be simplified, and misalignment of patterns may be prevented.

Also, according to one or more exemplary embodiments, a bank corresponding to a pixel-defining layer is formed after an anode is patterned, and thus, an aperture ratio of a display apparatus may decrease.

Also, according to one or more exemplary embodiments, an end of an anode is covered by an organic functional layer, and thus, a phenomenon in which an electric field is focused to the end of the anode may be alleviated.

Also, according to one or more exemplary embodiments, an end of an organic functional layer is covered by a bank, and thus, degradation of the organic functional layer may be alleviated.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments.

Although exemplary embodiments and implementations have been described herein, other exemplary embodiments and modifications will be apparent from this description. Accordingly, the inventive concept is not limited to such exemplary embodiments, but rather to the broader scope of the presented claims and various obvious modifications and equivalent arrangements.

What is claimed is:

1. A method of manufacturing an organic light-emitting display apparatus, the method comprising:
    forming, on a substrate, a plurality of anodes, including a first anode and a second anode, spaced apart from each other;
    forming a first lift-off layer on the plurality of anodes;
    forming a first photoresist directly on the first lift-off layer;
    etching the first lift-off layer using the first photoresist layer, thereby removing a first portion of the first lift-off layer at an area corresponding to the first anode so that a second portion of the first lift-off layer remains, wherein a first undercut profile is formed under a boundary surface with a remaining portion of the first photoresist layer such that the second portion of the first lift-off layer is spaced apart from a side surface of the first anode by a predetermined distance;
    forming a first organic functional layer covering an upper surface and side surfaces of the first anode and comprising an emission layer;
    removing the second portion of the first lift-off layer by using a first solvent;

forming a second lift-off layer on the first organic functional layer and the second anode on which the first organic functional layer is not formed;

forming a second photoresist directly on the second lift-off layer;

etching the second lift-off layer using the second photoresist layer, thereby removing a first portion of the second lift-off layer at an area corresponding to the second anode so that a second portion of the second lift-off layer remains, wherein a second undercut profile is formed under a boundary surface with a remaining portion of the second photoresist layer such that the second portion of the second lift-off layer is spaced apart from a side surface of the second anode by a predetermined distance;

forming a second organic functional layer covering an upper surface and side surfaces of the second anode and comprising an emission layer;

removing the second portion of the second lift-off layer by using a second solvent;

forming a first bank between the first organic functional layer and the second organic functional layer; and forming a cathode on the first organic functional layer, the second organic functional layer, and the first bank.

2. The method of claim 1, wherein each of the first and second lift-off layers comprises a fluoropolymer.

3. The method of claim 2, wherein each of the first and second lift-off layers further comprises a photosensitive material.

4. The method of claim 1, wherein each of the first solvent and the second solvent comprises fluorine.

5. The method of claim 1, wherein the first bank comprises a fluoropolymer.

6. The method of claim 5, wherein the first bank further comprises a photosensitive material.

7. The method of claim 5, wherein a second bank comprising a photosensitive material is further formed on the first bank.

8. The method of claim 1, further comprising applying heat to the first bank after the forming of the first bank.

9. The method of claim 1, wherein auxiliary cathodes, which are separated and respectively arranged on the first organic functional layer and the second organic functional layer, are further formed before the cathode is formed.

* * * * *